United States Patent
Nakao

(10) Patent No.: US 9,515,174 B2
(45) Date of Patent: Dec. 6, 2016

(54) METHOD OF MANUFACTURING A SEMICONDUCTOR STORAGE DEVICE

(71) Applicant: ROHM CO., LTD., Kyoto (JP)

(72) Inventor: Yuichi Nakao, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 180 days.

(21) Appl. No.: 14/054,298

(22) Filed: Oct. 15, 2013

(65) Prior Publication Data

US 2014/0045308 A1 Feb. 13, 2014

Related U.S. Application Data

(62) Division of application No. 12/585,947, filed on Sep. 29, 2009, now Pat. No. 8,575,676.

(30) Foreign Application Priority Data

Sep. 30, 2008 (JP) .................................. 2008-253085

(51) Int. Cl.
| | |
|---|---|
| *H01L 21/336* | (2006.01) |
| *H01L 29/66* | (2006.01) |
| *H01L 21/28* | (2006.01) |
| *H01L 21/762* | (2006.01) |
| *H01L 27/115* | (2006.01) |
| *H01L 29/423* | (2006.01) |

(52) U.S. Cl.
CPC ... *H01L 29/66825* (2013.01); *H01L 21/28273* (2013.01); *H01L 21/76232* (2013.01); *H01L 27/11521* (2013.01); *H01L 29/42324* (2013.01)

(58) Field of Classification Search
CPC .................... H01L 21/28273; H01L 21/76232; H01L 27/11521; H01L 29/42324; H01L H01L 29/66825
See application file for complete search history.

(56) References Cited

U.S. PATENT DOCUMENTS

| | | | |
|---|---|---|---|
| 5,949,101 A | 9/1999 | Aritome | |
| 6,153,472 A | 11/2000 | Ding et al. | |
| 6,222,225 B1 * | 4/2001 | Nakamura | ............ H01L 27/115 257/315 |

(Continued)

FOREIGN PATENT DOCUMENTS

| | | |
|---|---|---|
| JP | 8-125148 | 5/1996 |
| JP | 2000-124431 A | 4/2000 |

(Continued)

*Primary Examiner* — Meiya Li
(74) *Attorney, Agent, or Firm* — Rabin & Berdo, P.C.

(57) ABSTRACT

A method for manufacturing a semiconductor storage device includes forming a first insulating film on a semiconductor substrate; forming a first conductive layer; forming a trench in the semiconductor substrate and the first conductive layer by etching; forming a deposition layer by depositing an insulating material in the trench; removing by etching a side portion of the deposition layer to form a side surface that has a flat surface and a curved surface with a lower edge that is in contact with a side surface of the first conductive layer and to form a gap between the curved and the side surfaces; forming a second conductive layer; removing the deposition layer until at least the curved surface of the side surface is exposed to form an embedded insulator in the trench; forming a second insulating film; and forming a control gate on the embedded insulator and the second insulating film.

16 Claims, 8 Drawing Sheets

(56) References Cited

U.S. PATENT DOCUMENTS

| | | |
|---|---|---|
| 6,291,855 B1 | 9/2001 | Chang et al. |
| 7,560,768 B2 | 7/2009 | Koh et al. |
| 2002/0093073 A1 | 7/2002 | Mori et al. |
| 2003/0075756 A1 | 4/2003 | Suzuki |
| 2003/0185071 A1* | 10/2003 | Yoshino ............ H01L 21/28202 365/200 |
| 2004/0053502 A1 | 3/2004 | Sonoda et al. |
| 2004/0072408 A1 | 4/2004 | Yun et al. |
| 2004/0238881 A1 | 12/2004 | Ozawa |
| 2005/0116304 A1 | 6/2005 | Sonoda et al. |
| 2005/0167745 A1 | 8/2005 | Ishida et al. |
| 2006/0001076 A1 | 1/2006 | Ozawa |
| 2006/0258092 A1* | 11/2006 | Sato .................. G11C 16/0483 438/257 |
| 2009/0029523 A1 | 1/2009 | Seo et al. |

FOREIGN PATENT DOCUMENTS

| | | |
|---|---|---|
| JP | 2000-174242 A | 6/2000 |
| JP | 2002-203919 A | 7/2002 |
| JP | 2002-217318 A | 8/2002 |
| JP | 2004-022819 A | 1/2004 |
| JP | 2004-111547 A | 4/2004 |
| JP | 2004-172567 A | 6/2004 |
| JP | 2005-158805 A | 6/2005 |
| JP | 2006-019579 A | 1/2006 |
| JP | 2006-319202 A | 11/2006 |
| JP | 2007-123945 A | 5/2007 |

* cited by examiner

METHOD OF MANUFACTURING A SEMICONDUCTOR STORAGE DEVICE

CROSS-REFERENCE TO RELATED APPLICATIONS

This application is a divisional of application Ser. No. 12/585,947, filed on Sep. 29, 2009. Furthermore, this application claims the benefit of priority of Japanese application 2008-253085 filed on Sep. 30, 2008. The disclosures of these prior U.S. and Japanese applications are incorporated herein by reference.

BACKGROUND OF THE INVENTION

Field of the Invention

The present invention relates to a nonvolatile semiconductor storage device, such as a flash memory, etc., and a method for manufacturing the same.

Description of the Related Art

Flash memories are known as one type of nonvolatile memory. Among flash memories, there are those in which element isolation is achieved by a LOCOS (local oxidation of silicon) structure and those in which element isolation is achieved by an STI (shallow trench isolation) structure. In comparison to a LOCOS structure, an STI structure has an advantage of enabling reduction of memory cell size.

FIG. 4 is a schematic sectional view of a flash memory having an STI structure.

The flash memory 101 includes a silicon substrate 102. A plurality of trenches 103 are formed in parallel at fixed intervals in the silicon substrate 102.

An embedded body 104, made of silicon oxide ($SiO_2$), is embedded in each trench 103. The embedded body 104 protrudes from a top surface of the silicon substrate 102, and a side surface of the protruding portion is a flat surface orthogonal to the top surface of the silicon substrate 102. Also, an upper surface of the embedded body 104 is a flat surface orthogonal to the side surface and parallel to the top surface of the silicon substrate 102.

A tunnel oxide film 105 is formed on the top surface of the silicon substrate 102.

At a side of the embedded body 104 in a direction orthogonal to a direction of extension of the trench 103, a floating gate 108, made of a first polysilicon layer 106 and a second polysilicon layer 107, is formed on the tunnel oxide film 105. The floating gate 108 has a predetermined width in the direction of extension of the trench 103.

The first polysilicon layer 106 and the second polysilicon layer 107 are laminated in that order on the tunnel oxide film 105. An interface between the first polysilicon layer 106 and the second polysilicon layer 107 is positioned more toward the silicon substrate 102 side than the upper surface of the embedded body 104. Aside surface of the first polysilicon layer 106 and a side surface of a bottom portion of the second polysilicon layer 107 are thus in contact with the side surface of the embedded body 104. The side surface of the second polysilicon layer 107 is a flat surface orthogonal to the upper surface of the embedded body 104. An upper surface of the second polysilicon layer 107 is a flat surface parallel to the top surface of the silicon substrate 102.

An insulating film 109 having an ONO (oxide-nitride-oxide) structure is formed on the upper surface and the side surface, in the direction orthogonal to the direction of extension of the trench 103, of the second polysilicon layer 107. The insulating film 109 is also formed on the embedded body 104 and extends continuously and rectilinearly via tops of the plurality of floating gates 108 that are aligned in the direction of extension of the trenches 103.

A control gate 110, made of polysilicon, is formed on the insulating film 109. The control gate 110 is formed not only above the floating gate 108 but also to the side thereof.

In the flash memory 101 shown in FIG. 4, not only the upper surface of the floating gate 108 but also the side surface of the floating gate 108 opposes the control gate 110 via the insulating film 109, and enlargement of an area of opposition of the floating gate 108 and the control gate 110 is thereby achieved. By enlargement of the area of opposition of the floating gate 108 and the control gate 110, a capacitance $C_{ONO}$ between the floating gate 108 and the control gate 110 is increased, and a coupling ratio $C_{ONO}/(C_{ONO}+C_{TOX})$, which is a ratio of the capacitance $C_{ONO}$ with respect to a sum of the capacitance $C_{ONO}$ and a capacitance $C_{TOX}$ between the silicon substrate 102 and the floating gate 108, is made large. The larger the coupling ratio becomes, the more an operation margin (operation stability) of the flash memory 101 is improved.

However, further increase of the coupling ratio is being demanded recently, and for this purpose, an innovation is required in the structure of the memory cell.

SUMMARY OF THE INVENTION

An object of the present invention is to provide a semiconductor storage device that enables increase of the coupling ratio and a method for manufacturing the same.

A semiconductor storage device according to one aspect of the present invention includes: a semiconductor substrate; an embedded insulator embedded in a trench formed in the semiconductor substrate and having an upper portion protruding above a top surface of the semiconductor substrate; a first insulating film formed on the top surface of the semiconductor substrate; a floating gate formed on the first insulating film at a side of the embedded insulator, having a side portion arching out above the embedded insulator, and having a side surface that is made up of a flat surface and a curved surface continuing below the flat surface; a second insulating film contacting an upper surface, the flat surface and the curved surface of the floating gate; and a control gate opposing the upper surface, the flat surface and the curved surface of the floating gate across the second insulating film.

In this semiconductor storage device, the trench is formed in the semiconductor substrate. The embedded insulator is embedded in the trench. The upper portion of the embedded insulator protrudes above the top surface of the semiconductor substrate. The first insulating film is formed on the top surface of the semiconductor substrate. The floating gate is formed on the first insulating film at the side of the embedded insulator. The side portion of the floating gate arches out above the embedded insulator and the side surface thereof is made up of the flat surface and the curved surface continuing below the flat surface. On the upper surface and the side surface, made up of the flat surface and the curved surface, of the floating gate, the second insulating film is formed in contact with the respective surfaces. Then, the control gate is formed on the second insulating film. The control gate opposes the upper surface and the side surface of the floating gate across the second insulating film.

The side portion of the floating gate arches out above the embedded insulator, and thus in comparison to a configuration where the floating gate does not arch out above the embedded insulator, a planar size of the floating gate can be enlarged without enlarging a planar size of a memory cell.

Also, the side surface of the floating gate is made up of the flat surface and the curved surface, and thus in comparison to a configuration where the side surface is made up of just the flat surface, a side surface area of the floating gate can be enlarged without increasing a height of the floating gate. Consequently, an area of opposition of the floating gate and the control gate can be enlarged. By enlargement of the area of opposition of the floating gate and the control gate, a capacitance $C_{ONO}$ between the floating gate and the control gate can be increased, and a coupling ratio $C_{ONO}/(C_{ONO}+C_{TOX})$, which is a ratio of the capacitance $C_{ONO}$ with respect to a sum of the capacitance $C_{ONO}$ and a capacitance $C_{TOX}$ between the semiconductor substrate and the floating gate, can be increased.

Preferably, a portion of the control gate opposing the curved surface of the floating gate contacts the second insulating film. By this arrangement, the capacitance $C_{ONO}$ between the floating gate and the control gate can be increased reliably.

The floating gate may have a structure where a first conductive layer and a second conductive layer are laminated in that order on the first insulating film, a side portion of the second conductive layer may arch out above the embedded insulator, and a side surface of the second conductive layer may have the flat surface and the curved surface.

A semiconductor storage device with the above configuration can be manufactured by a manufacturing method including the following steps I to XI:

I. a step of forming a first insulating film on a semiconductor substrate;

II. a step of forming a first conductive material layer, made of a material of the first conductive layer, on the first insulating film;

III. a step of forming a hard mask having an opening on the first conductive material layer;

IV. a step of forming a trench in the semiconductor substrate by performing etching using the hard mask to selectively remove the first conductive material layer, the first insulating film and the semiconductor substrate;

V. a step of forming a deposition layer by depositing an insulating material on the trench so as to completely fill the trench, the portions of the first insulating film and the first conductive material layer removed by etching and an interior of the opening of the hard mask;

VI. a step of removing the hard mask after the forming of the deposition layer;

VII. a step of forming a side surface of the deposition layer that is exposed from the first insulating layer to a flat surface and a curved surface continuing below the flat surface by performing etching after the removal of the hard mask to remove a side portion of the deposition layer;

VIII. a step of forming a second conductive material layer, made of the material of the second conductive layer, on the first conductive material layer;

IX. a step of performing etching after the forming the second conductive material layer to form an embedded insulator on the trench by removing the deposition layer until at least a portion of the second conductive material layer in contact with the curved surface is exposed;

X. a step of forming a second insulating film on an exposed upper surface and side surface of the second conductive material layer; and XI. a step of forming a control gate on the embedded insulator and the second insulating film.

Preferably, a side surface of the first conductive layer continues below the curved surface of the second conductive layer, and the second insulating film contacts at least a portion of the side surface of the first conductive layer. By this arrangement, the side surface area of the floating gate can be enlarged further. Consequently, the capacitance $C_{ONO}$ between the floating gate and the control gate can be increased further and the coupling ratio can be increased further.

The semiconductor storage device of this configuration can be obtained by removing the deposition layer (the embedded insulator) until a portion of the side surface of the first conductive material layer is exposed in step IX and forming the second insulating film on the exposed side surface of the first conductive material layer as well in step X.

The foregoing and other objects, features and effects of the present invention will become more apparent from the following detailed description of the embodiments with reference to the attached drawings.

DETAILED DESCRIPTION OF THE PREFERRED EMBODIMENTS

Figure 1:
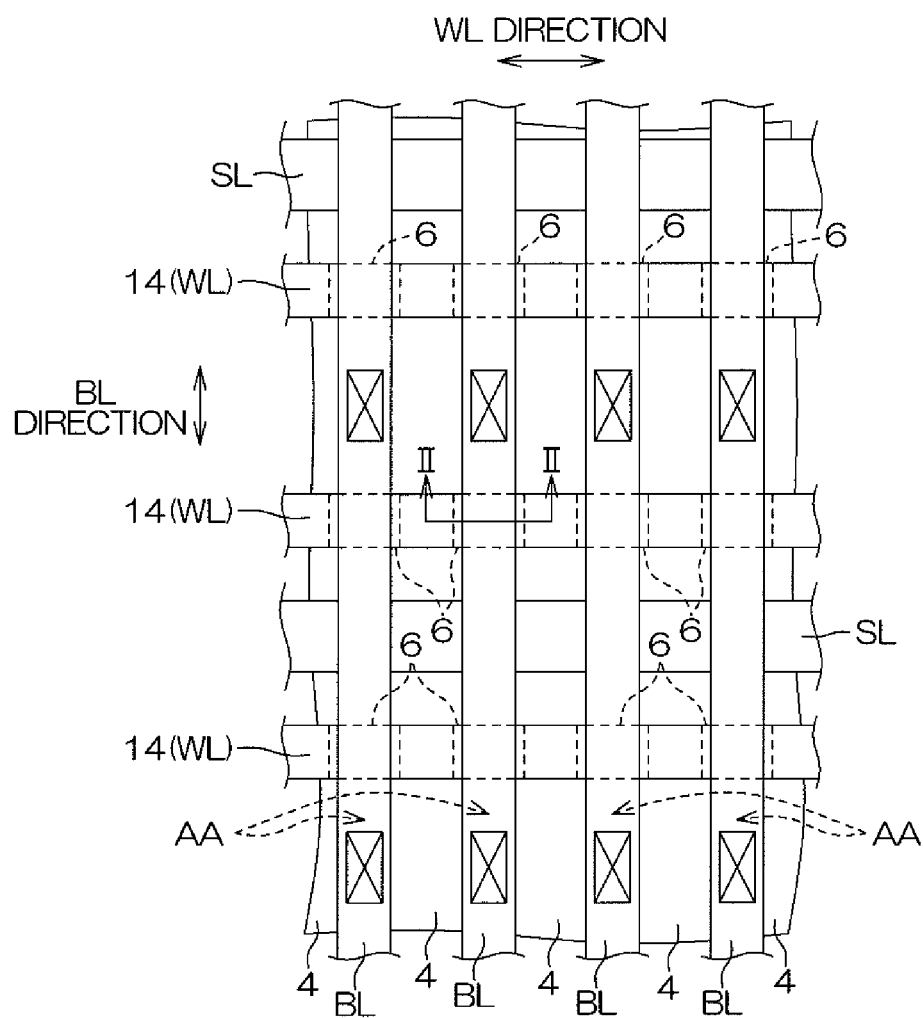
FIG. 1 is a plan view of a layout of respective portions of a semiconductor storage device according to an embodiment of the present invention.
Figure 2:
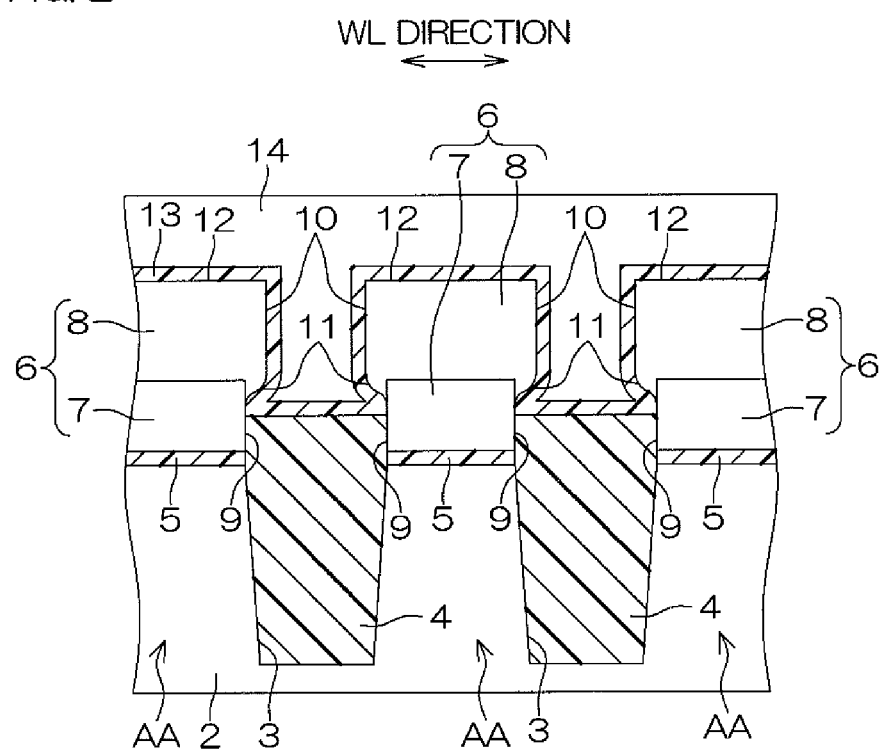
FIG. 2 is a schematic sectional view taken on cutting line II-II of the semiconductor storage device shown in FIG. 1.

FIG. 1 is a plan view of a layout of respective portions of a semiconductor storage device according to an embodiment of the present invention. FIG. 2 is a schematic sectional view taken on cutting line II-II of the semiconductor storage device shown in FIG. 1.

The semiconductor storage device 1 is a NOR flash memory with an STI structure. As shown in FIG. 2, the semiconductor storage device 1 includes a semiconductor substrate 2. The semiconductor substrate 2 is, for example, a silicon substrate. A plurality of trenches 3 are formed in parallel at fixed intervals in a predetermined direction (this direction shall hereinafter be referred to as the "WL direction", i.e., the Word Line, WL, direction) in the semiconductor substrate 2.

An embedded insulator 4, made of silicon oxide, is embedded in each trench 3. The embedded insulator 4 protrudes from a top surface of the semiconductor substrate 2, and a side surface of the protruding portion is a flat surface orthogonal to the top surface of the semiconductor substrate 2. Also, an upper surface of the embedded insulator 4 is a flat surface orthogonal to the side surface and parallel to the top surface of the semiconductor substrate 2. An amount of protrusion of the embedded insulator 4 from the top surface of the semiconductor substrate 2 is, for example, 30 to 80 nm.

A tunnel oxide film 5, made of silicon oxide, is formed on the top surface of the semiconductor substrate 2.

Intervals between the respective trenches 3 are active areas AA that are separated by the trenches 3. In each active area AA, a plurality of floating gates 6 are formed and aligned at fixed intervals in a direction (this direction shall hereinafter be referred to as the "BL direction", i.e., the Bit Line, BL, direction) orthogonal to the WL direction. The floating gates 6 are also aligned in the WL direction. That is, the floating gates 6 are disposed at lattice points at fixed intervals respectively in the WL direction and the BL direction. Each floating gate 6 has a predetermined width (for example, 90 nm) in the BL direction.

Each floating gate 6 has a laminated structure of a first conductive layer 7 and a second conductive layer 8. The first conductive layer 7 and the second conductive layer 8 are laminated on the tunnel oxide film 5 in that order.

The first conductive layer 7 is made, for example, of doped polysilicon. A side surface 9 of the first conductive layer 7 is a flat surface along a side surface of the portion of the embedded insulator 4 that protrudes from the top surface of the semiconductor substrate 2. An upper surface of the first conductive layer 7 is a flat surface orthogonal to the side surfaces 9 of the first conductive layer 7.

The second conductive layer 8 is made, for example, of doped polysilicon. A width in the BL direction of the second conductive layer 8 is the same as a width in the BL direction of the first conductive layer 7. A width in the WL direction of the second conductive layer 8 is larger than a width in the WL direction of the first conductive layer 7 and lower end portions of the second conductive layer 8 clamp upper end portions of the first conductive layer 7 from both sides in the WL direction. Side portions in the WL direction of the second conductive layer 8 thus arch out above the embedded insulator 4. Then, a side surface in the WL direction of each arching-out portion (the side portion of the second conductive layer 8) is made up of a flat surface 10, parallel to the side surface 9 in the WL direction of the first conductive layer 7, and a curved surface 11, continuing below the flat surface 10 and smoothly connecting a step difference between the flat surface 10 and the side surface 9 in the WL direction of the first conductive layer 7. An upper surface 12 of the second conductive layer 8 is a flat surface orthogonal to the flat surface 10.

On the floating gate 6 is formed an ONO film 13 having an ONO (oxide-nitride-oxide) structure in which a silicon nitride film is sandwiched by a pair of silicon oxide films. A width in the BL direction of the ONO film 13 is the same as a width in the BL direction of the floating gate 6. The ONO film 13 covers the upper surface 12 and the side surface (flat surface 10 and curved surface 11) in the WL direction of the second conductive layer 8, contacts a portion of the side surface 9 in the WL direction of the first conductive layer 7, and further covers an upper surface of the embedded insulator 4. The ONO film 13 on the respective floating gates 6 aligned in the WL direction is thus continuous.

A control gate 14 is formed on the ONO film 13. The control gate 14 is made, for example, of doped polysilicon. A width in the BL direction of the control gate 14 is the same as the widths in the BL direction of the floating gate 6 and the ONO film 13. The control gate 14 is also formed above the embedded insulator 4 and a portion opposing the curved surface 11 of the side surface of the floating gate 6 is in contact with the ONO film 13. Then, the control gate 14 is formed as a single line extending in the WL direction via tops of the respective floating gates 6 that are aligned in the WL direction. Word lines WL, each made up of the control gate 14, are thereby formed in parallel at fixed intervals in the BL direction on the semiconductor substrate 2 as shown in FIG. 1. An upper surface of the control gate 14 is flattened.

In each active area AA, a source region and a drain region are formed alternately across a region opposing the floating gate 6 in a top layer portion of the semiconductor substrate 2. A single floating gate 6 is included in a single memory cell. Two memory cells that are adjacent in the BL direction share a source region, and each of these memory cells share a drain region with another memory cell adjacent in the BL direction.

As shown in FIG. 1, a plurality of source lines SL are disposed in parallel in the BL direction on the semiconductor substrate 2. Each source line SL extends rectilinearly in the WL direction above the source regions that are aligned in the WL direction and are put in contact with the respective source regions below. The source line SL is made, for example, of tungsten (W).

Also, as shown in FIG. 1, a plurality of bit lines BL are disposed in parallel in the WL direction on the semiconductor substrate 2. Each bit line BL is disposed via an interlayer insulating film on an active area AA, extends in the BL direction, and are put in contact with the respective drain regions below. The bit line BL is made, for example, of tungsten (W).

Writing of data into each memory cell is achieved by injecting hot electrons from the drain region into the floating gate 6. That is, the source line SL is set to a ground potential (0V). A high voltage is then applied to the word line WL and the bit line BL. Electrons are thereby made to flow from the source region to the drain region, hot electrons are generated in a vicinity of the drain region, and these hot electrons are injected into the floating gate 6. Consequently, a threshold voltage of the memory cell increases.

On the other hand, to erase data, the word line WL is set to the ground potential (0V). Then, a high voltage is applied to the source line SL. By the application of the high voltage, electrons are extracted into the source region from the floating gate 6 (FN (Fowler-Nordheim) tunnel). Consequently, the threshold voltage of the memory cell decreases.

The threshold voltage of the memory cell thus differs between the state where electrons are accumulated in the floating gate 6 and the state where electrons are not accumulated. During reading of data from the memory cell, a potential difference is formed between the source line SL and the bit line BL and a suitable reading voltage is applied to the control gate. If, by application of the reading voltage, a current flows across the drain and the source, a logic signal "1" is obtained. On the other hand, if a current does not flow across the drain and the source, a logic signal "0" is obtained.

FIGS. 3A to 3J are schematic sectional views successively showing a manufacturing process of the semiconductor storage device.

Figure 3A:
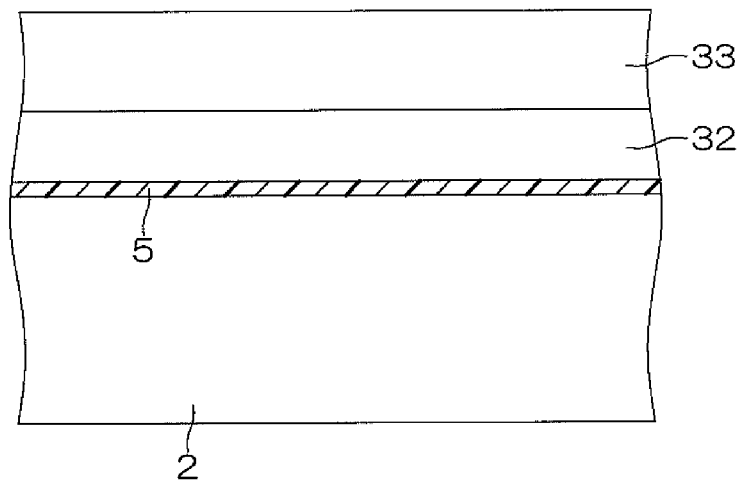
FIGS. 3A to 3J are schematic sectional views successively showing a manufacturing process of the semiconductor storage device.

First, as shown in FIG. 3A, a tunnel oxide film 5 is formed on the top surface of the semiconductor substrate 2 by thermal oxidation. A doped polysilicon layer 32 and a silicon nitride (SiN) layer 33 are then laminated in that order on the tunnel oxide film 5 by thermal CVD (chemical vapor deposition).

Figure 3B:
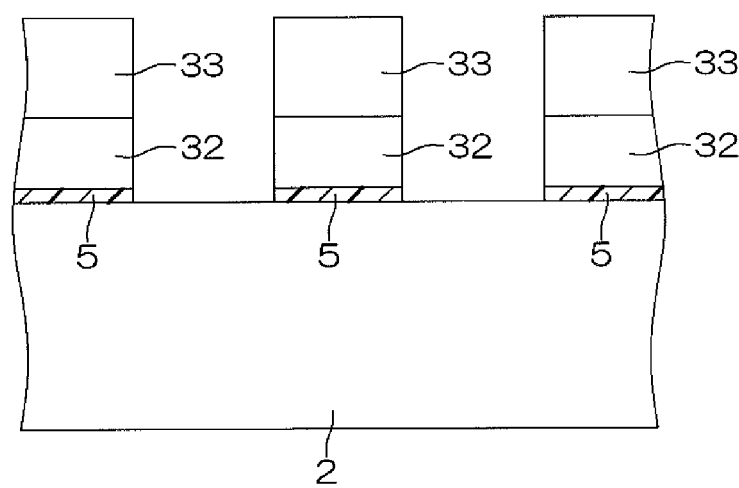

Then, as shown in FIG. 3B, the silicon nitride layer 33 is patterned by photolithography and etching. By this patterning, the silicon nitride layer 33 is made a hard mask having openings opposing portions at which the trenches 3 are to be formed. By then performing etching using the hard mask, the doped polysilicon layer 32 and the tunnel oxide film 5 are selectively removed in that order.

Figure 3C:
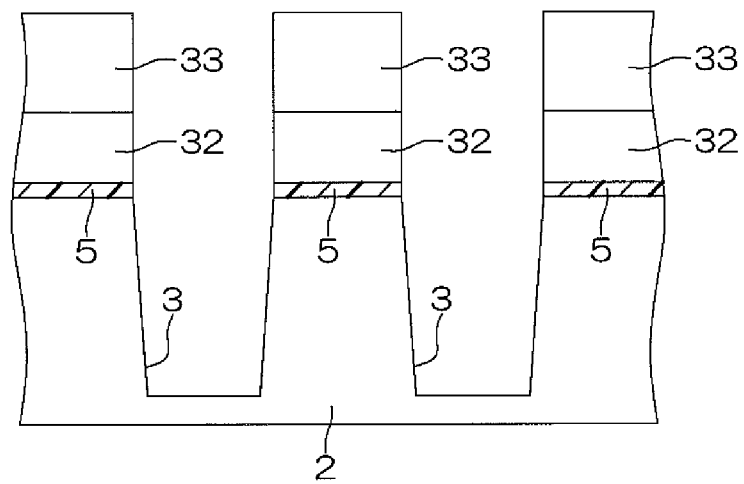

Then, as shown in FIG. 3C, by performing etching using the tunnel oxide film 5, the doped polysilicon layer 32, and the silicon nitride layer 33 as a mask, trenches 3 are formed in the semiconductor substrate 2.

Figure 3D:
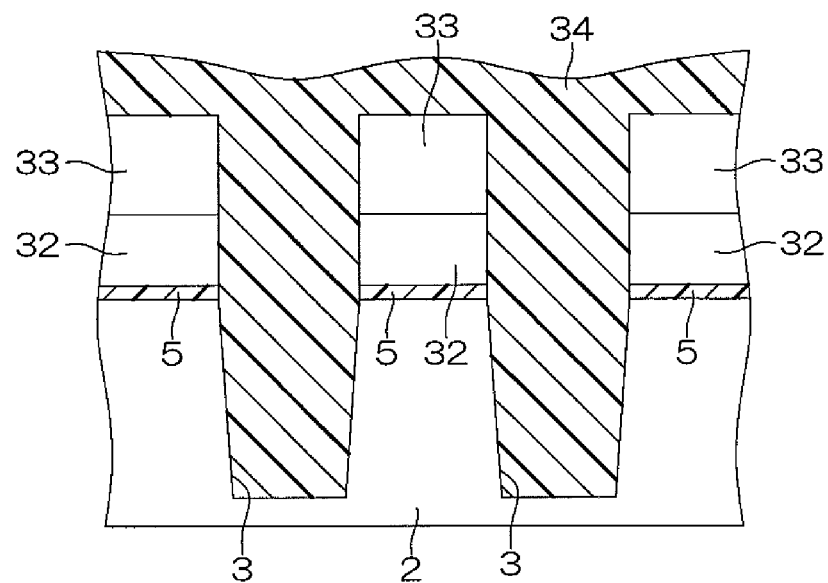

Thereafter, as shown in FIG. 3D, a silicon oxide film is formed on inner surfaces of the trenches 3 by thermal oxidation method (liner oxidation method). A deposition layer of silicon oxide is then formed on the trenches 3 by HDP-CVD (high density plasma chemical vapor deposition). The trenches 3 are completely filled and an entirety of a top surface of the silicon nitride layer 33 is covered by the deposition layer. The silicon oxide film on the inner surfaces of the trenches 3 and the deposition layer of silicon oxide formed by HDP-CVD are made integral as a silicon oxide layer 34.

Figure 3E:
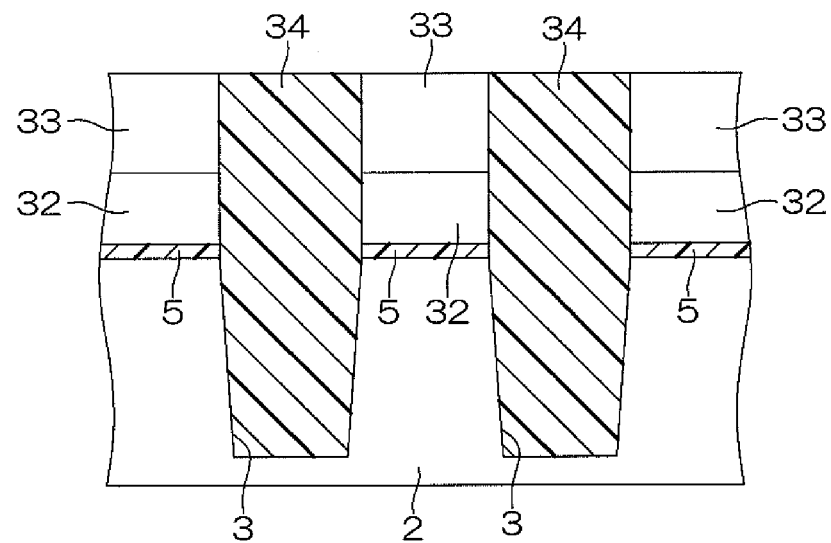

Thereafter, as shown in FIG. 3E, a top surface of the silicon oxide layer 34 is polished (flattened) by CMP (chemical mechanical polishing) using a ceria slurry. The polishing is continued until the top surface of the silicon oxide layer 34 inside the trenches 3 is made flush with the top surface of the silicon nitride layer 33.

Figure 3F:
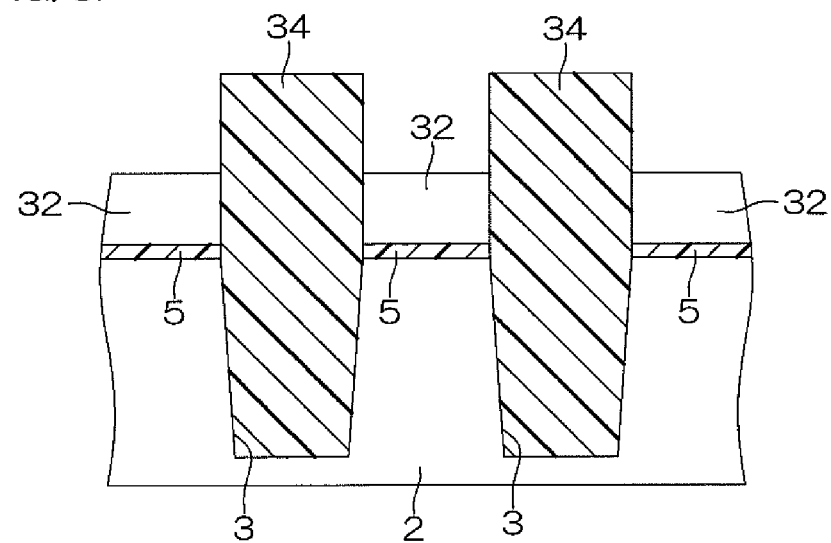

Then, as shown in FIG. 3F, the silicon nitride layer 33 is removed by etching using phosphoric acid ($H_3PO_4$).

Figure 3G:
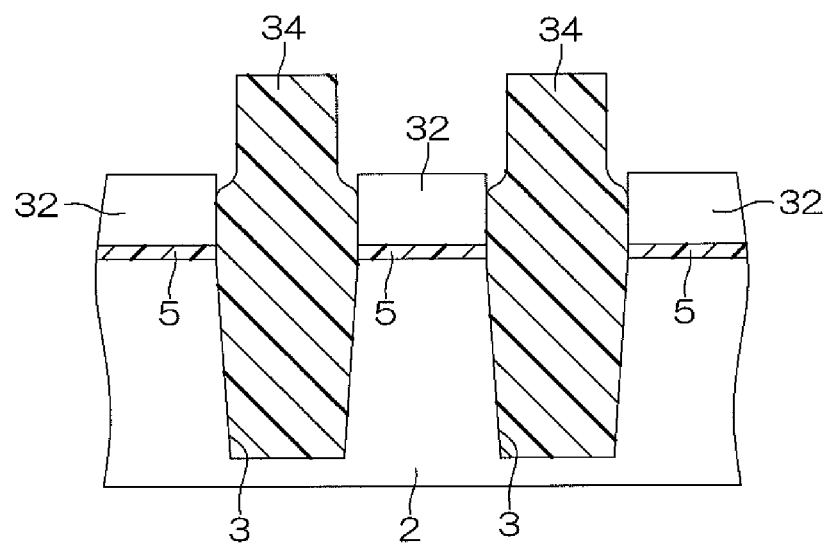

Thereafter, as shown in FIG. 3G, side portions of the silicon oxide layer 34 on the trenches 3 that are exposed from the doped polysilicon layer 32 are removed by etching using hydrofluoric acid (HF). Side surfaces of these portions are thereby configured respectively as a flat surface and a curved surface continuing below the flat surface.

Figure 3H:
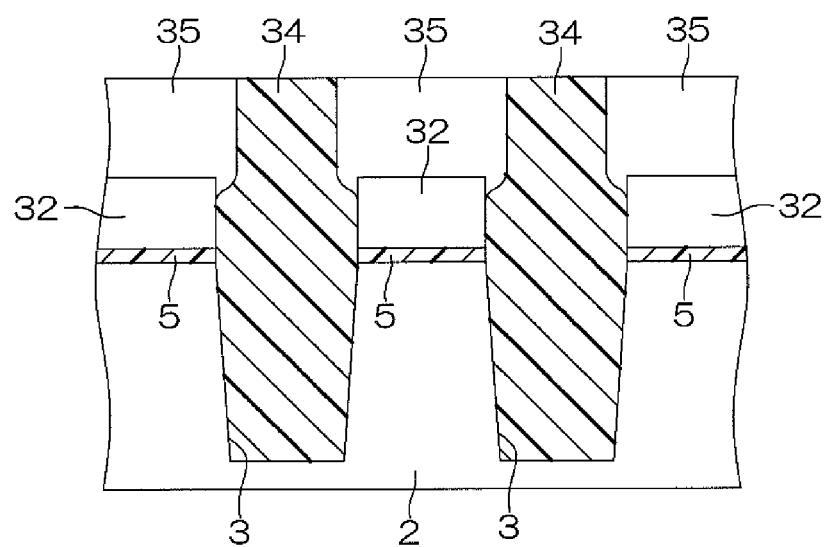

Then, as shown in FIG. 3H, a new doped polysilicon layer 35 is laminated on the doped polysilicon layer 32 by thermal CVD. The doped polysilicon layer 35 is then polished by CMP. The polishing is continued until a top surface of the doped polysilicon layer 35 is made flush with the top surface of the silicon oxide layer 34.

Figure 3I:
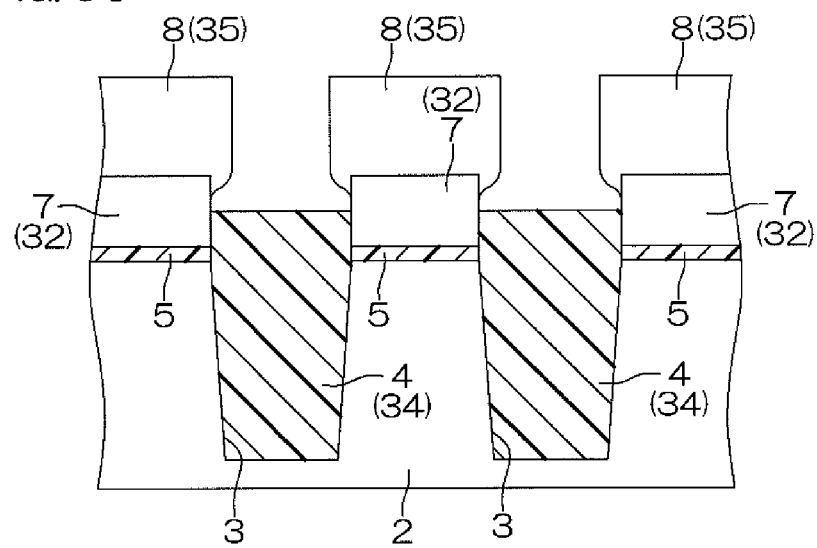

Thereafter, as shown in FIG. 3I, an upper portion of the silicon oxide layer 34 is removed by etching using hydrofluoric acid. The silicon oxide layer 34 is thereby made the embedded insulator 4 embedded in each trench 3. Also, by the etching, the doped polysilicon layers 32 and 35 are patterned. By this patterning, the doped polysilicon layers 32 and 35 are made the first conductive layer 7 and the second conductive layer 8, respectively.

Figure 3J:
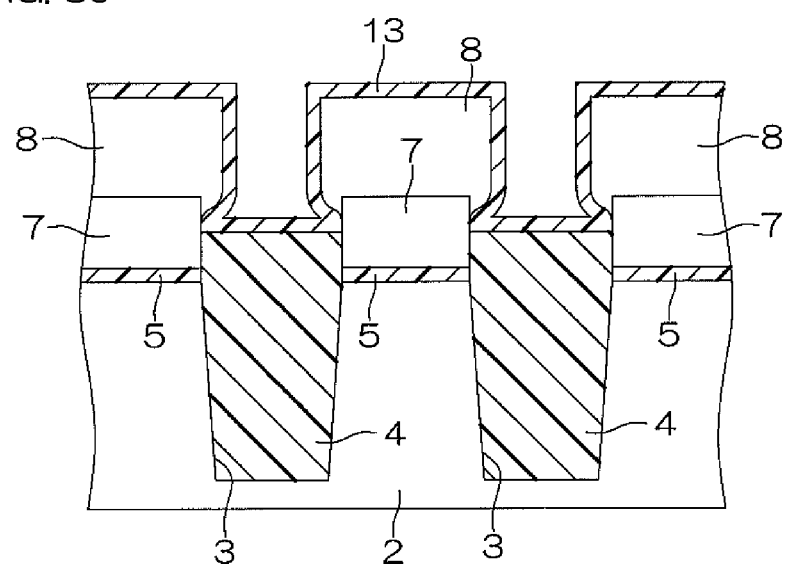
Figure 4:
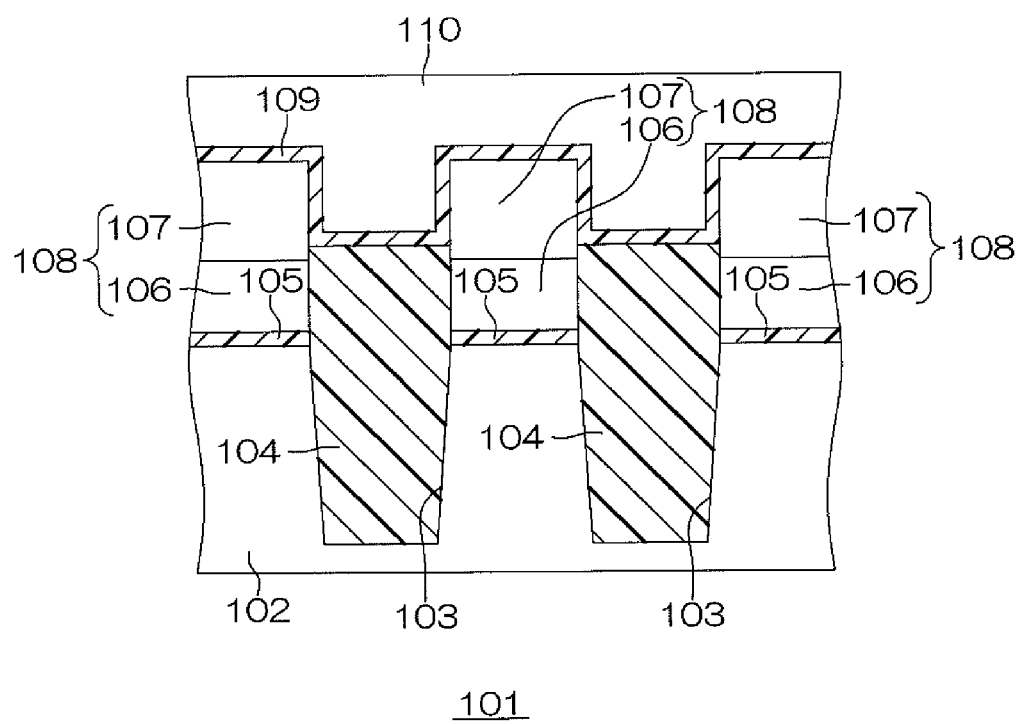
FIG. 4 is a schematic sectional view of a conventional flash memory having an STI structure.

Then, as shown in FIG. 3J, the ONO film 13 is formed. The ONO film 13 is attained by forming a silicon oxide film by radical oxidation method, then forming a silicon nitride film on the silicon oxide film by CVD, and further forming a silicon oxide film on the silicon nitride film by radical oxidation method. Although CVD may be adopted to form the silicon oxide films, silicon oxide films of good quality can be formed by adopting radical oxidation method.

After the ONO film 13 has been formed, by thermal CVD, a deposition layer of doped polysilicon is formed on the ONO film 13. Then, a top surface of the deposition layer is flattened by CMP, and the control gate 14, having the flat top surface on the ONO film 13, is thereby formed as shown in FIG. 1.

As described above, in the semiconductor storage device 1, the trenches 3 are formed in the semiconductor substrate 2. The embedded insulator 4 is embedded in each trench 3. The upper portion of the embedded insulator 4 protrudes above the top surface of the semiconductor substrate 2. The tunnel oxide film 5 is formed on the top surface of the semiconductor substrate 2. The floating gate 6 is formed on the tunnel oxide film 5 at the side of the embedded insulator 4. The side portion of the floating gate 6 arches out above the embedded insulator 4 and the side surface thereof is made up of the flat surface 10 and the curved surface 11 continuing below the flat surface 10. On the upper surface 12 and the side surface, made up of the flat surface 10 and the curved surface 11, of the floating gate 6, the ONO film 13 is formed in contact with the respective surfaces. Then, the control gate 14 is formed on the ONO film 13. The control gate 14 opposes the upper surface and the side surface of the floating gate 6 across the ONO film 13.

The side portion of the floating gate 6 arches out above the embedded insulator 4, and thus in comparison to a configuration where the floating gate 6 does not arch out above the embedded insulator 4, a planar size of the floating gate 6 can be enlarged without enlarging a planar size of the memory cell. Also, the side surface of the floating gate 6 is made up of the flat surface 10 and the curved surface 11, and thus in comparison to a configuration where the side surface is made up of just the flat surface, a side surface area of the floating gate 6 can be enlarged without increasing a height of the floating gate 6. Consequently, an area of opposition of the floating gate 6 and the control gate 14 can be enlarged. By enlargement of the area of opposition of the floating gate 6 and the control gate 14, a capacitance $C_{ONO}$ between the floating gate 6 and the control gate 14 can be increased, and a coupling ratio $C_{ONO}/(C_{ONO}+C_{TOX})$, which is a ratio of the capacitance $C_{ONO}$ with respect to a sum of the capacitance $C_{ONO}$ and a capacitance $C_{TOX}$ between the semiconductor substrate and the floating gate 6, can be increased.

Also, the portion of the control gate 14 opposing the curved surface 11 of the side surface of the floating gate 6 contacts ONO film 13. The capacitance $C_{ONO}$ between the floating gate 6 and the control gate 14 can thereby be increased reliably.

Further, the side surface 9 of the first conductive layer 7 of the floating gate 6 continues below the curved surface 11 of the second conductive layer 8. Then, the ONO film 13 contacts a portion of the side surface 9 of the first conductive layer 7. The side surface area of the floating gate 6 can thereby be enlarged further. Consequently, the capacitance $C_{ONO}$ between the floating gate 6 and the control gate 14 can be increased further and the coupling ratio can be increased further.

Although an embodiment of the present invention has been described above, various design changes can be applied to this embodiment within the scope of matters described in the claims.

The present invention can be applied not only to a flash memory but widely to nonvolatile semiconductor storage devices having a floating gate, such as an EPROM (erasable programmable read only memory), an EEPROM (electrically erasable programmable read only memory), a DRAM (dynamic random access memory), etc.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A method for manufacturing a semiconductor storage device including a floating gate having a laminated structure of a first conductive layer and a second conductive layer, the method comprising:
    forming a first insulating film on a semiconductor substrate;
    forming a first conductive material layer, made of a material of the first conductive layer, on the first insulating film;
    forming a hard mask having an opening on the first conductive material layer;
    forming a trench in the semiconductor substrate and the first conductive layer by etching using the hard mask to selectively remove the first conductive material layer, the first insulating film, and the semiconductor substrate, wherein the first conductive layer is formed through the etching of the first conductive material layer;

forming a deposition layer by depositing an insulating material in the trench so as to completely fill the trench, interiors of respective openings of the first insulating film and the first conductive layer, and an interior of the opening of the hard mask;

removing the hard mask after forming of the deposition layer;

removing a side portion of the deposition layer to form a side surface of the deposition layer, wherein the side surface of the deposition layer has a flat surface and a curved surface continuing below the flat surface by etching after the removal of the hard mask, wherein the curved surface is formed so that a lower edge of the deposition layer is in contact with a side surface of the first conductive layer and so that a gap is defined between the curved surface and the side surface of the first conductive layer;

forming the second conductive layer on the first conductive layer such that the second conductive layer fills the gap and is in direct contact with the flat surface and the curved surface of the side surface of the deposition layer, whereby the second conductive layer is formed so as to have a side surface that is in direct contact with the side surface of the deposition layer, wherein the side surface of the second conductive layer has a flat surface and a curved surface continuing below the flat surface respectively being in direct contact with the flat surface and the curved surface of the deposition layer;

removing, after forming the second conductive layer, the deposition layer until at least the curved surface of the side surface of the second conductive layer is exposed, thereby forming an embedded insulator in the trench;

forming a second insulating film on an exposed upper surface and on the side surface of the second conductive layer; and forming a control gate on the embedded insulator and the second insulating film such that the control gate has a portion disposed above the trench and opposed to the curved surface of the side surface of the second conductive layer across the second insulating film.

2. The method according to claim 1, wherein the deposition layer is removed until a portion of the side surface of the first conductive layer is exposed, and the second insulating film is formed to be in contact with the exposed portion of the side surface of the first conductive layer as well.

3. The method according to claim 1, wherein the embedded insulator is formed so that the embedded insulator has an upper portion protruding above a top surface of the semiconductor substrate.

4. The method according to claim 3, wherein the embedded insulator is formed so that an amount of protrusion of the embedded insulator from the top surface of the semiconductor substrate is 30 nm to 80 nm.

5. The method according to claim 1, wherein the second conductive layer and the embedded insulator are formed so that the second conductive layer has an upper side portion arching out above the embedded insulator.

6. The method according to claim 1, wherein the first conductive layer, the second conductive layer and the embedded insulator are formed so that a joint between the first conductive layer and the second conductive layer is separated from a top surface of the embedded insulator.

7. The method according to claim 1, wherein the second conductive layer is formed so that the second conductive layer is wider than the first conductive layer and has an overhanging side portion extending along a top surface of the semiconductor substrate beyond the side surface of the first conductive layer to overhang above the embedded insulator.

8. The method according to claim 7, wherein the second insulating film is formed so as to contact a lower surface of the overhanging side portion to intervene between the overhanging side portion and the embedded insulator.

9. The method according to claim 1, wherein the second insulating film is formed so as to contact the side surface of the first conductive layer below the second conductive layer.

10. The method according to claim 1, wherein the second conductive layer is formed so as to cover an upper surface of the first conductive layer.

11. The method according to claim 1, wherein the first insulating film is made of silicon oxide as a tunnel oxide film.

12. The method according to claim 1, wherein the first conductive material layer is made of doped polysilicon.

13. The method according to claim 1, wherein the second conductive layer is made of doped polysilicon.

14. The method according to claim 1, wherein the second insulating film is formed to have an ONO (oxide-nitride-oxide) structure in which a silicon nitride film is sandwiched by a pair of silicon oxide films.

15. The method according to claim 14, wherein the silicon oxide films of the ONO structure are formed by radical oxidation method, and the silicon nitride film of the ONO film is formed by CVD (Chemical Vapor Deposition) method.

16. The method according to claim 1, further comprising a step of forming a source region and a drain region across a region opposing the floating gate in a top layer portion of the semiconductor substrate such that the source region and the drain region are shared with another floating gate disposed adjacent to the floating gate in a BL (bit line) direction.

* * * * *